United States Patent
Streppel et al.

(10) Patent No.: US 11,444,224 B2
(45) Date of Patent: Sep. 13, 2022

(54) LIGHT-EMITTING SEMICONDUCTOR COMPONENT

(71) Applicant: Osram OLED GmbH, Regensburg (DE)

(72) Inventors: Ulrich Streppel, Regensburg (DE); Hailing Cui, Regensburg (DE); Desiree Queren, Neutraubling (DE); Dajana Durach, Starnberg (DE)

(73) Assignee: OSRAM OLED GMBH, Regensburg (DE)

(*) Notice: Subject to any disclaimer, the term of this patent is extended or adjusted under 35 U.S.C. 154(b) by 115 days.

(21) Appl. No.: 16/964,608

(22) PCT Filed: Jan. 25, 2019

(86) PCT No.: PCT/EP2019/051898
§ 371 (c)(1),
(2) Date: Jul. 24, 2020

(87) PCT Pub. No.: WO2019/145502
PCT Pub. Date: Aug. 1, 2019

(65) Prior Publication Data
US 2021/0057617 A1    Feb. 25, 2021

(30) Foreign Application Priority Data

Jan. 26, 2018 (DE) .................. 10 2018 101 786.3

(51) Int. Cl.
*H01L 33/50* (2010.01)
*H01L 25/075* (2006.01)
*H01L 33/60* (2010.01)

(52) U.S. Cl.
CPC ........ *H01L 33/508* (2013.01); *H01L 25/0753* (2013.01); *H01L 33/60* (2013.01)

(58) Field of Classification Search
CPC .. H01L 33/505; H01L 25/0753; H01L 33/508
See application file for complete search history.

(56) References Cited

U.S. PATENT DOCUMENTS

2003/0173599 A1   9/2003   Nakai
2008/0111141 A1*  5/2008   Li ......................... H01L 33/54
                                                                257/88

(Continued)

FOREIGN PATENT DOCUMENTS

| EP | 2362420 A1 | 8/2011 |
| JP | 2003110146 A | 4/2003 |
| JP | 2017025167 A | 2/2017 |

OTHER PUBLICATIONS

International Search Report issued for corresponding PCT Application No. PCT/EP2019/051898, dated Apr. 8, 2019, 3 pages (for informational purpose only).

(Continued)

*Primary Examiner* — Feifei Yeung Lopez
(74) *Attorney, Agent, or Firm* — Viering, Jentschura & Partner mbB

(57) ABSTRACT

A light-emitting semiconductor component may include a conversion layer, a radiation surface, and a plurality of adjacently arranged emission regions configured to be operated separately, individually and/or in groups. The conversion layer may be arranged downstream of the emission regions in the direction of radiation of the emission regions. The emission regions may be configured to emit primary radiation of a first wavelength range into the conversion layer. The conversion layer may be configured to convert at least a portion of the primary radiation into secondary radiation of a second wavelength range. Mixed radiation is configured to be emitted from the light-emitting semiconductor component at the radiation surface. The mixed radiation may include primary radiation and secondary radiation.

(Continued)

A probability that primary radiation travelling from the emission region to the radiation surface is converted into secondary radiation may vary along the radiation surface by a maximum factor of 2.

12 Claims, 5 Drawing Sheets

(56) References Cited

U.S. PATENT DOCUMENTS

| | | | | |
|---|---|---|---|---|
| 2014/0168988 | A1* | 6/2014 | Petersen | B29C 43/021 |
| | | | | 362/293 |
| 2015/0338065 | A1* | 11/2015 | Wang | G02F 1/133617 |
| | | | | 362/97.1 |
| 2016/0359089 | A1* | 12/2016 | Moon | H01L 33/507 |
| 2018/0120451 | A1* | 5/2018 | Houha | G01T 1/2002 |
| 2018/0226543 | A1* | 8/2018 | Masui | H01L 33/505 |

OTHER PUBLICATIONS

German Search Report issued for corresponding DE Application No. DE10 2018 101 786.3, dated Aug. 6, 2018, 8 pages (for informational purpose only.

* cited by examiner

FIG 4A

X-Coordinates

|    | U1        | U2        | U3      | U4       | U5       |
|----|-----------|-----------|---------|----------|----------|
| V1 | -0.071250 | -0.035625 | 0.00000 | 0.035625 | 0.071250 |
| V2 | -0.071250 | -0.043233 | 0.00000 | 0.043233 | 0.071250 |
| V3 | -0.071250 | -0.030738 | 0.00000 | 0.030738 | 0.071250 |
| V4 | -0.071250 | -0.043233 | 0.00000 | 0.043233 | 0.071250 |
| V5 | -0.071250 | -0.035625 | 0.00000 | 0.035625 | 0.071250 |

Y-Coordinates

|    | U1        | U2        | U3        | U4        | U5        |
|----|-----------|-----------|-----------|-----------|-----------|
| V1 | -0.071250 | -0.071250 | -0.071250 | -0.071250 | -0.071250 |
| V2 | -0.035625 | -0.043233 | -0.047106 | -0.043233 | -0.035625 |
| V3 |  0.00000  |  0.00000  |  0.00000  |  0.00000  |  0.00000  |
| V4 |  0.035625 |  0.043233 |  0.047106 |  0.043233 |  0.035625 |
| V5 |  0.071250 |  0.071250 |  0.071250 |  0.071250 |  0.071250 |

Y-Coordinates

|    | U1         | U2         | U3         | U4         | U5         |
|----|------------|------------|------------|------------|------------|
| V1 | 0.00010000 | 0.00010000 | 0.00010000 | 0.00010000 | 0.00010000 |
| V2 | 0.00010000 | 0.015027   | 0.014968   | 0.015027   | 0.00010000 |
| V3 | 0.00010000 | 0.015030   | 0.020100   | 0.015030   | 0.00010000 |
| V4 | 0.00010000 | 0.015027   | 0.014968   | 0.015027   | 0.00010000 |
| V5 | 0.00010000 | 0.00010000 | 0.00010000 | 0.00010000 | 0.00010000 |

FIG 4B.1
FIG 4B.2
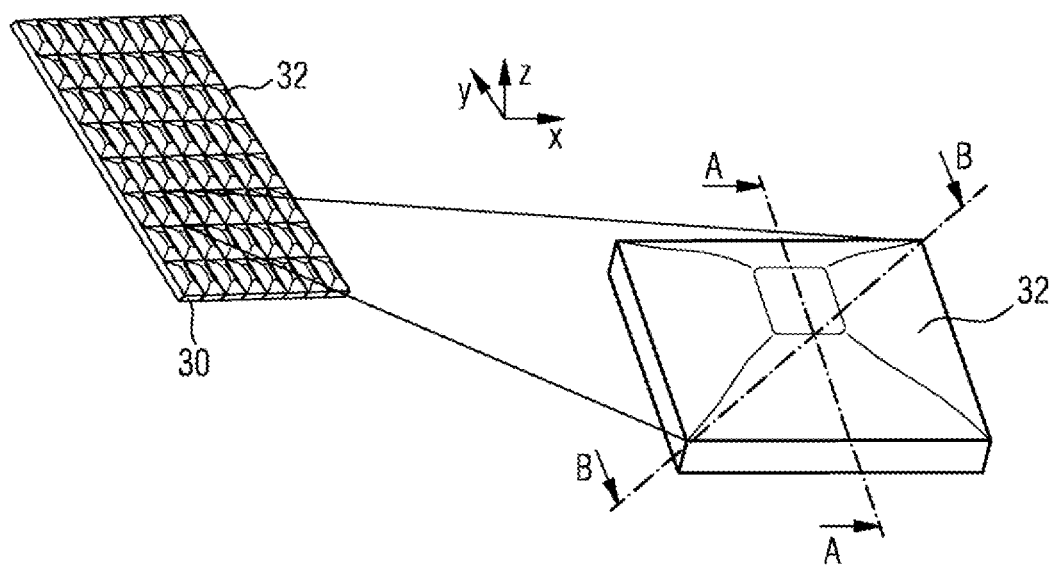
FIG 4C
FIG 4D
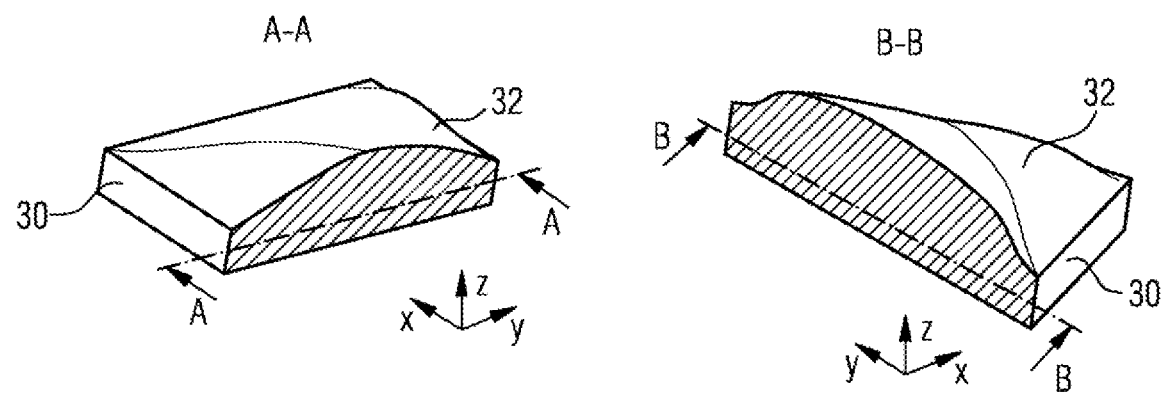

LIGHT-EMITTING SEMICONDUCTOR COMPONENT

CROSS-REFERENCE TO RELATED APPLICATIONS

The present application is a national stage entry according to 35 U.S.C. § 371 of PCT application No. PCT/EP2019/051898 filed on Jan. 25, 2019; which claims priority to German Patent Application Serial No. 10 2018 101 786.3 filed on Jan. 26, 2018; all of which are incorporated herein by reference in their entirety and for all purposes.

TECHNICAL FIELD

A light-emitting semiconductor component is specified, having a plurality of adjacently arranged emission regions that can be separately operated, individually and/or in groups.

BACKGROUND

The light-emitting semiconductor component is a light-emitting semiconductor component, for example an LED component, which is designed to emit mixed radiation of a specified chromaticity coordinate, in particular a white chromaticity coordinate.

SUMMARY

One of the objects to be achieved is to specify, inter alia, such a light-emitting semiconductor component which has an improved radiation characteristic, in particular an improved color impression.

For example, the emission regions are arranged spaced apart from each other on a substrate. For example, the distance between adjacent emission regions is a maximum of 300 µm, such as a maximum of 100 µm, when the emission regions are part of a common semiconductor chip. Alternatively, the distance between adjacent emission regions is a maximum of 1 mm, such as a maximum of 300 µm, when the emission regions are each formed with different semiconductor chips. The distance between two emission regions is measured in each case between centers of the emission regions.

The emission regions are formed with a semiconductor material, for example, and include an active region which is configured to generate and emit electromagnetic radiation. This electromagnetic radiation is referred to below as primary radiation.

The emission regions can be arranged along a plane at the nodal points of an imaginary regular grid, in particular a rectangular grid.

According to one embodiment, the light-emitting semiconductor component has a conversion layer which is downstream of the emission regions in the radiation direction, in particular in their main radiation direction. For example, at least a major part of the primary radiation is incident on the conversion layer. The conversion layer includes, for example, a matrix material and a conversion material, such as an inorganic fluorescent material and/or quantum dots, which is embedded in the matrix material. Alternatively, the conversion material can form a self-supporting structure without a matrix material. The conversion material can be configured to convert primary radiation into electromagnetic radiation of a longer wavelength range. The converted radiation is also referred to below as secondary radiation.

The wavelength range of the primary radiation may overlap with the wavelength range of the secondary radiation.

According to one embodiment, the emission regions emit primary radiation into the conversion layer. For example, the conversion layer is at least partially transparent to the primary radiation. In particular, the primary radiation is at least partially scattered in the conversion layer. The primary radiation is, for example, electromagnetic radiation in a blue wavelength range.

According to one embodiment, the conversion layer converts at least part of the primary radiation into secondary radiation. In other words, part of the power of the primary radiation is converted into secondary radiation. In particular, the conversion layer converts primary radiation into secondary radiation that has a longer wavelength than the primary radiation. In particular, the conversion layer converts at least 70%, such as at least 80%, of the primary radiation into secondary radiation.

According to one embodiment, the light-emitting semiconductor component has a radiation surface through which mixed radiation, in particular mixed-colored light, emerges from the light-emitting semiconductor component. For example, the radiation surface is an external surface of the conversion layer. Alternatively, the radiation surface can be formed by a different external surface of the light-emitting semiconductor component. In particular, at least a major part of the emitted mixed radiation is emitted from the semiconductor component through the radiation surface.

According to one embodiment, the mixed radiation includes primary and secondary radiation. In particular, the mixed radiation includes exclusively primary radiation and secondary radiation which has passed through the conversion layer. For example, all components of the mixed radiation emitted by the light-emitting semiconductor component through the radiation surface have passed through the conversion layer.

According to one embodiment, the probability of primary radiation being converted into secondary radiation as it travels along the path from the emission region to the radiation surface changes along the radiation surface by a maximum factor of 2. In a non-limiting embodiment, this probability changes by a maximum factor of 1.5. In particular, the probability of the mixed radiation emitted by the radiation surface being converted into secondary radiation on the path from the emission region to the exit surface varies along the radiation surface by a maximum factor of 2, such as by a maximum factor of 1.5. For example, the ratio of the intensities of primary radiation to secondary radiation along the radiation surface changes by a maximum factor of 2, in particular by a maximum factor of 1.5.

According to one embodiment, the light-emitting semiconductor component includes a plurality of emission regions arranged side by side that can be separately operated, individually and/or in groups, and a conversion layer. The conversion layer is located downstream of the emission regions in the direction of radiation of the emission regions. The emission regions emit primary radiation from a first wavelength range into the conversion layer, and the conversion layer converts at least part of the primary radiation into secondary radiation from a second wavelength range. The light-emitting semiconductor component has a radiation surface through which mixed radiation emerges from the light-emitting semiconductor component, wherein the mixed radiation includes the primary and secondary radiation, and the probability that primary radiation is converted into secondary radiation on the path from the emission region to the radiation surface changes by a maximum factor of 2 along the radiation surface.

A light-emitting semiconductor component described here is based on the following observations, among others. Light-emitting semiconductor components with a plurality of emission regions which are spaced apart next to each other along a plane, and in which primary radiation emitted by the emission regions is at least partially converted by means of a conversion layer, are generally characterized by an inhomogeneous color gradient over the radiation surface of the light-emitting semiconductor component, in particular if only individual emission regions or groups of emission regions are operated.

The light-emitting semiconductor component described here makes use, among other things, of the idea of designing the semiconductor component in such a way that the probability with which primary radiation is converted into secondary radiation changes as little as possible along the radiation surface. This is achieved by equalizing the lengths of the various travel paths of primary radiations within the conversion layer. The primary radiations are generated in the active region and emerge, for example, at different angles at different points of an emission region, or at different emission regions. In particular, the lengths of the travel paths are adjusted relative to each other such that the standard deviation of the lengths of the travel paths is reduced. For example, in the light-emitting semiconductor component the length of the travel paths within the conversion layer is equalized, so that from a statistical point of view, primary radiation has essentially traveled an equal distance within the conversion layer regardless of the point at which it passes through the radiation surface. Alternatively or additionally, the concentration of the conversion material in the conversion layer varies in such a way that mixed radiation, regardless of where it passes through the radiation surface, is essentially converted from primary radiation into secondary radiation with an equal probability. This leads to a particularly small variation in the ratio of the intensities of primary and secondary radiation over the radiation surface. This advantageously facilitates a light-emitting semiconductor component in which the mixed radiation emitted via the radiation surface produces a very homogeneous color impression to the human eye.

According to one embodiment, the conversion layer is designed in a contiguous, in particular simply contiguous, form. For example, the conversion layer is located downstream of the plurality of emission regions in their direction of radiation, so that at least a major part, in particular at least 80%, of the emitted primary radiation strikes the conversion layer. In particular, the conversion layer is downstream of all emission regions of the light-emitting semiconductor component in the direction of radiation, in particular in its main direction of radiation. Advantageously, a contiguous conversion layer, which is assigned to the multiplicity of emission regions, is particularly cost-effective and efficient to produce.

According to one embodiment, the conversion layer has a thickness perpendicular to its main extension plane (in the following the "vertical direction") that varies along the main extension plane. For example, this thickness of the conversion layer varies periodically along the main extension plane. In particular, the periodicity with which this thickness varies corresponds to the periodicity with which the emission regions are arranged adjacent to each other along the main extension plane. In particular, this thickness of the conversion layer varies along the main extension plane in two mutually perpendicular directions.

According to one embodiment, the thickness of the conversion layer has a local maximum at each point where it overlaps with emission regions in the vertical direction, and a local minimum at each point where it does not overlap with an emission region in the vertical direction. For example, at a local maximum the thickness is at least 1.25 times, in particular at least 2 times, such as at least 10 times, the thickness at a local minimum. The local maxima of the thickness can be almost equal throughout. The local minima of the thickness can be almost equal throughout. In particular, the concentration of the conversion material over the entire volume of the conversion layer is sufficiently homogeneous. Thus, the probability with which primary radiation is converted into secondary radiation is essentially constant per unit of length of the path traveled by the primary radiation in the conversion layer. For example, the concentration of the conversion material within the conversion layer varies by no more than 20%, such as by no more than 10%.

For example, the conversion layer is formed with a plurality of convex curved surfaces on a side facing away from the emission regions. Alternatively or additionally, the conversion layer may have convex curved surfaces on a side facing towards the emission regions. In particular, the conversion layer can be formed in such a way that a biconvex or a plane-convex lens-shaped region is arranged downstream of each of the emission regions. In particular, the conversion layer is designed in such a way that the mean length of the travel path of primary radiation through the conversion layer is independent of where the primary radiation passes through the exit surface, and independent of the point at which the primary radiation has exited the emission region. Advantageously, the probability with which primary radiation is converted into secondary radiation is therefore essentially constant along the exit surface from a statistical point of view.

According to one embodiment, the light-emitting semiconductor component includes an intermediate layer which is formed with a material transparent to the primary and secondary radiation. For example, the intermediate layer absorbs a maximum of 1% of the primary radiation and/or secondary radiation. In particular, the intermediate layer is formed with a transparent material in which the primary and/or secondary radiation is scattered to a negligible degree. For example, the conversion layer is designed in a contiguous, in particular simply contiguous, form. For example, the intermediate layer is a casting layer, which is designed, for example, to protect the light-emitting semiconductor component from environmental influences. Furthermore, the intermediate layer may be configured to interact with primary radiation and/or secondary radiation. For example, the primary radiation and/or secondary radiation is selectively refracted at an interface of the intermediate layer. In particular, the intermediate layer may have concave and/or convex curved surfaces that form a lens for primary and/or secondary radiation.

The intermediate layer can extend over the multiplicity of emission regions and can be located downstream of the emission regions in the direction of radiation. In particular, at least a major part of the primary radiation emitted by the emission regions passes through the intermediate layer. For example, the intermediate layer is connected to the conversion layer in a materially bonded manner over the whole surface. In particular, main surfaces of the intermediate layer and the conversion layer are in direct contact with each other. For example, the intermediate layer and the conversion layer have different refractive indices so that primary radiation is refracted at an interface between the intermediate layer and the conversion layer. Advantageously, the intermediate layer can be used to adjust the distance between the conversion layer and the emission regions when the intermediate layer is arranged between the conversion layer and the emission regions.

According to one embodiment, the intermediate layer is arranged between the conversion layer and the emission regions, and the intermediate layer has convex curved surfaces on a side facing away from the emission regions. According to the embodiment, the thickness of the conversion layer has a local maximum at the points where it overlaps with emission regions in the vertical direction, and a local minimum at the points where it does not overlap with an emission region in the vertical direction. For example, primary radiation first passes through the intermediate layer and is then refracted at its interface with the conversion layer. For example, the convex curved surfaces of the intermediate layer refract the primary radiation in such a way that the mean distances traveled by the primary radiations within the conversion layer to the radiation surface are equalized. In particular, the intermediate layer and the conversion layer have different refractive indices. For example, the ratio of the refractive indices is at least 1.1:1, in particular at least 1.34:1. For example, the difference between a first refractive index of the intermediate layer and a second refractive index of the conversion layer is at least 0.25, such as at least 0.4, in particular at least 0.5.

According to an embodiment, the conversion layer includes a conversion material, the concentration of which varies along the main extension plane of the conversion layer. The conversion layer has a local extremum of the concentration where it overlaps with an emission region in the vertical direction. For example, in regions that overlap with emission regions in the vertical direction the conversion layer has a local maximum of the concentration of the conversion material, and in regions that do not overlap with emission areas in the vertical direction it has a local minimum of the concentration of the conversion material. In particular, the concentration of the local maxima differs by no more than 20%, in particular by no more than 10%, such as by no more than 1%. In particular, the concentration of the local minima differs by no more than 20%, in particular by no more than 10%, such as by no more than 1%.

For example, the concentration of the conversion material varies periodically along the main extension plane of the conversion layer. In particular, the periodicity with which the concentration of the conversion material varies corresponds to the periodicity with which the emission regions are arranged along the main extension plane of the conversion layer.

The varying concentration causes the probability per unit length of the path with which primary radiation is converted into secondary radiation to vary. This probability can be greater in a region which overlaps vertically with an emission region than in a region that does not overlap vertically with an emission region. For example, primary radiation with a high emission angle travels a longer distance within the conversion layer on average than primary radiation with a low emission angle. The emission angle is defined as the angle between the vertical direction and the propagation direction of the relevant primary radiation as the primary radiation exits the emission region.

Regions of the conversion layer that do not overlap with emission regions are mostly traversed by primary radiation with a large emission angle. Consequently, in regions of the conversion layer that do not overlap with emission regions in the vertical direction, the probability of the conversion of primary radiation into secondary radiation per unit of length of the path is reduced. This reduced probability is achieved, for example, by the varying concentration of the conversion material. Advantageously, a varying concentration of the conversion material can lead to a homogeneous chromaticity coordinate of the mixed radiation emitted through the radiation surface along the radiation surface.

According to one embodiment, the intermediate layer has a first refractive index and the conversion layer has a second refractive index, wherein the conversion layer is arranged on a side of the intermediate layer facing away from the emission regions and the first refractive index is larger than the second refractive index. Alternatively, the intermediate layer is located on a side of the conversion layer facing away from the emission regions, and the second refractive index is larger than the first refractive index. For example, the first and the second refractive indices are adjusted relative to each other in such a way that the refractive indices along the path of the primary and/or secondary radiation become smaller. Advantageously, a rate of change of the refractive indices along the path of the primary and/or secondary radiation is therefore particularly small, so that reflections at interfaces between different materials are reduced. In particular, the primary and/or secondary radiation is decoupled from the semiconductor component in a particularly efficient manner.

According to one embodiment, the first refractive index of the intermediate layer varies along the main extension plane, wherein the first refractive index has a local extremum in the vertical direction where it overlaps with each emission region. In particular, in each part of the intermediate layer overlapping with an emission region in the vertical direction the first refractive index has a local maximum. Furthermore, local minima of the refractive index may occur in the parts of the intermediate layer that do not overlap with any emission region.

For example, in the intermediate layer, a lens array is formed with gradient-index lenses (abbreviated as: GRIN lenses). For example, one of the GRIN lenses is arranged overlapping with each emission region in the vertical direction. In particular, the GRIN lenses are each configured to collimate or focus primary radiation. Advantageously, the GRIN lenses are used to focus or collimate the primary radiation in such a way that the mean lengths of the travel paths of the primary radiation within the conversion layer are equalized.

According to one embodiment, by means of the intermediate layer a lens is formed above each emission region in the vertical direction, wherein the lens is configured to collimate or focus primary radiation. In particular, the collimated or focused primary radiation passes through the conversion layer. For example, the emission regions are each arranged at the focal point of one of the lenses, so that the lens collimates primary radiation emitted by the emission regions. In particular, the primary radiation is refracted by means of the lens in such a way that the path traveled by the primary radiation within the conversion layer is essentially constant from a statistical point of view.

According to one embodiment, the emission regions have edges that limit the emission regions along the main extension plane. Furthermore, the light-emitting semiconductor component has a diaphragm structure, which is formed with a material that absorbs and/or reflects the primary radiation and which is arranged overlapping with the edges in the vertical direction. In particular, the diaphragm structure overlaps at least partially with the emission regions in the vertical direction. For example, the diaphragm structure is configured to absorb or reflect at least a portion of the primary radiation emitted, in particular in the edge regions. For example, the diaphragm structure reduces the proportion of the primary radiation that travels a particularly long distance in the conversion layer. Advantageously, this equalization of the different lengths of the travel paths leads to a smaller change in the chromaticity coordinate of the mixed radiation along the exit surface.

According to one embodiment, the emission regions are parts of a common semiconductor chip. For example, the emission regions are produced jointly in the same manufacturing process. In particular, the emission regions can be identical in design, so that the emission regions have the same semiconductor layer sequence. In particular, the emission regions can be at least partially contiguous. For example, multiple emission regions may have one or more common, epitaxially produced semiconductor layers that are formed contiguously. In particular, the emission regions are configured to emit primary radiation of the same chromaticity coordinate.

The emission regions can have continuous semiconductor layers. In particular, the shape and surface area of the individual emission regions along the main extension plane of the emission regions is defined by contact structures, by means of which the emission regions are each energized. Alternatively, the shape and area of the emission regions are limited along their main extension plane, for example by trenches, which cut through at least one of the semiconductor layers. The trenches can be made, for example, by means of a lithographic process. The emission regions are arranged, for example, spaced apart from each other by the distance between adjacent contact structures and/or the width of the trenches.

Alternatively, the emission regions are formed, for example, by a plurality of semiconductor chips arranged on a common substrate. In particular, each emission region is formed by a separate semiconductor chip. Different semiconductor chips can each have different semiconductor layer sequences and can be produced independently of one another in separate manufacturing processes.

BRIEF DESCRIPTION OF THE FIGURES

In the following, the light-emitting semiconductor component described here is explained in more detail in conjunction with non-limiting embodiments and the associated figures.

FIG. 4A shows a tabular overview of points in a three-dimensional Cartesian coordinate system which describe a lens-shaped region formed with the conversion layer of a light-emitting semiconductor component described here, FIG. 4B.1 shows a three-dimensional schematic representation of lens-shaped regions formed with the conversion layer of a light-emitting component described here, and the surfaces of which can each be described with the points shown in FIG. 4A, FIG. 4B.2 shows an enlarged schematic representation of a single one of the lens-shaped regions of FIG. 4B.1, and FIGS. 4C and 4D each show a three-dimensional schematic sectional view of a single lens-shaped region, the section through the lens-shaped region passing along the cutting line A-A or B-B shown in FIG. 4B.2.

Identical, similar or equivalently functioning elements are labelled with the same reference signs in the figures. The figures and the relative proportions of the elements represented in the figures are not to be considered to be true to scale. Instead, individual elements may be shown exaggerated in size for ease of visualization and/or better understanding.

DESCRIPTION

Figure 1:
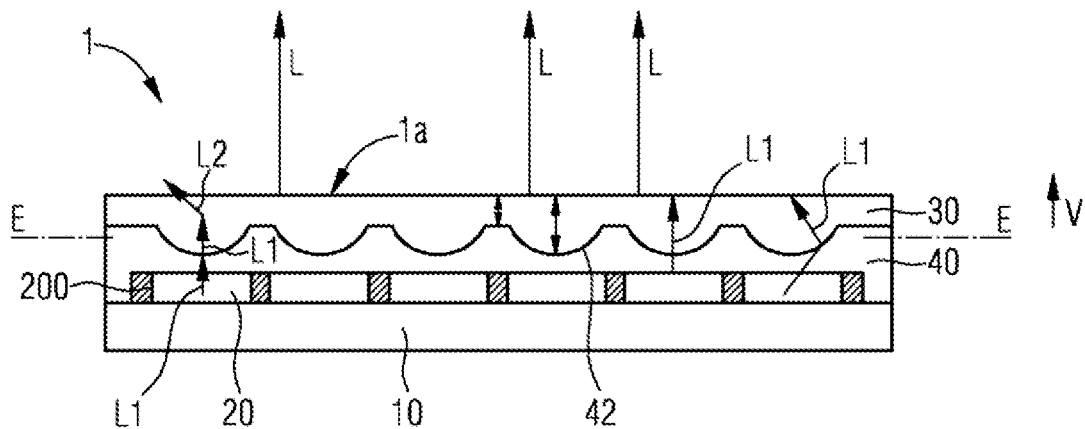
FIGS. 1, 2, 3, 5, 6, 7, 8 and 9 show schematic cross-sectional drawings of exemplary embodiments of a light-emitting semiconductor component.

FIG. 1 shows a schematic sectional view of a light-emitting semiconductor component 1 described here according to an exemplary embodiment. The light-emitting semiconductor component 1 includes a substrate 10 and a semiconductor chip 200 arranged on a main surface of the carrier 10 with a plurality of emission regions 20 arranged adjacently that can be separately operated, individually and/or in groups. A conversion layer 30 is located downstream of the emission regions 20 in the direction of radiation of the emission regions 20. The conversion layer 30 is designed to be simply contiguous and extends over the entirety of the emission regions 20. The emission regions 20 are configured to emit primary radiation L1 of a first wavelength range into the conversion layer 30. The conversion layer 30 is at least partially transparent to the primary radiation L1. At least a portion of the primary radiation L1 is converted in the conversion layer into secondary radiation L2 of a second wavelength range. For example, the conversion layer 30 is configured to convert primary radiation L1 of a blue wavelength range into secondary radiation L2 of a yellow wavelength range. Overall, the primary radiation L1 and the secondary radiation L2 are perceived by an observer as white mixed radiation. The conversion layer 30 includes a conversion material embedded in a matrix material, wherein the conversion material is configured to convert primary radiation into secondary radiation, and the matrix material forms a mechanically self-supporting structure.

The light-emitting semiconductor component 1 has a radiation surface 1a through which mixed radiation L exits from the light-emitting semiconductor component 1. The radiation surface 1a is formed by a surface of the conversion layer 30 which faces away from the emission regions 20. The mixed radiation L includes the primary radiation L1 and the secondary radiation L2. The probability of primary radiation L1 being L2 converted into secondary radiation as it travels along the path from the emission region to the radiation surface changes along the radiation surface 1a by a maximum factor of 2. In particular, the probability changes by a maximum factor of 1.5. As a result, the ratio of the intensities of primary radiation L1 to secondary radiation L2 along the radiation surface 1a varies by no more than a factor of 2, in particular by no more than a factor of 1.5.

The conversion layer 30 has a main extension plane E, along which the conversion layer 30 is formed contiguously. Perpendicular to the main extension plane E, along a vertical direction V, the conversion layer 30 has a thickness D. The thickness D varies along the main extension plane E. In regions where the conversion layer 30 overlaps with an emission region along the vertical direction V, the conversion layer has a local maximum of the thickness Dmax. In regions where the conversion layer 30 does not overlap with an emission region 20 along the vertical direction V, the thickness D has a local minimum Dmin.

An intermediate layer 40 is arranged between the conversion layer 30 and the emission regions 20. The intermediate layer 40 is designed to be simply contiguous and completely covers the emission regions 20. The intermediate layer 40 is formed with a material that is transparent to primary radiation L1 and secondary radiation L2, and has concave curved surfaces on one side facing the conversion layer 30. The conversion layer 30 is connected to the intermediate layer 40 over its whole surface on one side facing the intermediate layer 40. The intermediate layer 40, in particular the interface between the conversion layer 30 and the intermediate layer 40, forms a lens 42 above each emission region 20 in the vertical direction V, which interacts with the primary radiation L1.

The different thicknesses D of the conversion layer 30 and the lenses 42 are designed in such a way that the mean lengths of the paths traveled by primary radiations L1 from emission regions 20 to the radiation surface 1a are equalized with each other.

The intermediate layer 40 has a first refractive index N1 and the conversion layer 30 has a second refractive index N2, wherein the conversion layer 30 is arranged on a side of the intermediate layer 40 facing away from the emission regions 20. The first refractive index N1 is greater than the second refractive index N2. Thus, the primary radiation L1 and/or secondary radiation L2 passes through the intermediate layer 40 and the conversion layer 30 in the direction of decreasing refractive indices. Along the path of the primary L1 and/or secondary radiation L2 the rate of change is advantageously low, so that a particularly small proportion of the primary L1 and/or secondary radiation L2 is reflected at interfaces between layers and the primary L1 and/or secondary radiation L2 is decoupled particularly efficiently.

Figure 2:
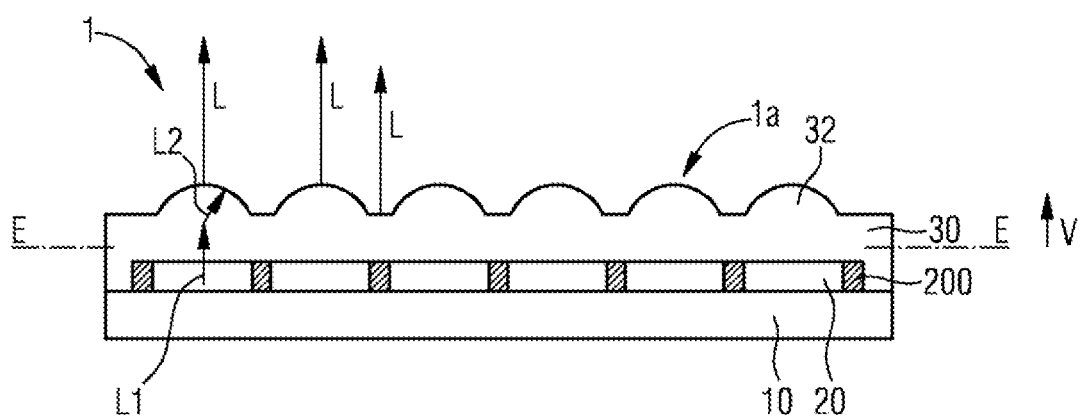

FIG. 2 shows a schematic sectional view of a light-emitting semiconductor component 1 described here according to an exemplary embodiment. In contrast to the exemplary embodiment shown in FIG. 1, the light-emitting semiconductor component 1 lacks an intermediate layer 40. The conversion layer 30 is arranged directly on the semiconductor chip 200. The side of the conversion layer 30 facing away from the emission regions forms the radiation surface 1a of the light-emitting semiconductor component.

The conversion layer 30 has convex curved surfaces on one side facing away from the emission regions 20. The convex curved surfaces are used to form lens-shaped regions 32, which are arranged downstream of the emission regions 20 along the vertical direction V. The convex curved surfaces can have a spherical, aspherical or cushion-shaped curvature.

Furthermore, the curvature of the curved surfaces can be described, for example, by means of a polynomial along the main extension plane E. For example, the convex curved surfaces are quadrant-symmetrical, in particular axially symmetric, in plan view of the main extension plane E. Along the main extension plane E of the conversion layer 30 the convex curved surfaces are arranged periodically so that lens-shaped areas 32 are arranged in the form of an array. The periodicity of the convex curved surfaces corresponds to the periodicity with which the emission regions 20 are arranged next to one another along the main extension plane E of the conversion layer 30.

Figure 3:
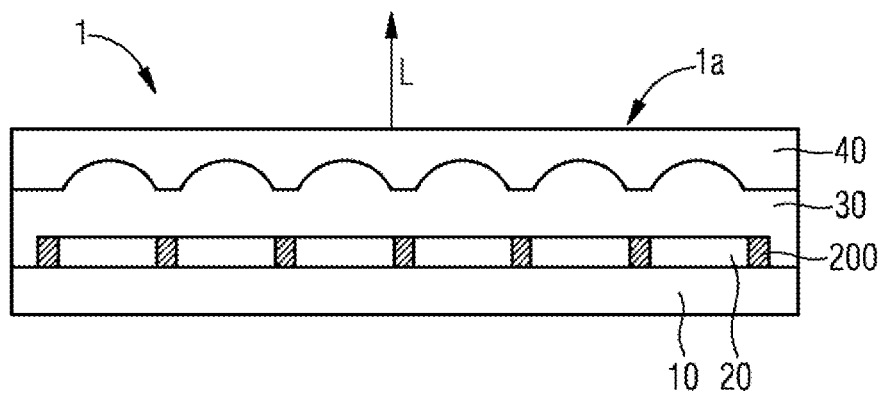

FIG. 3 shows a schematic sectional view of a light-emitting semiconductor component 1 described here according to an exemplary embodiment. In contrast to the exemplary embodiment shown in FIG. 2, the intermediate layer 40 is arranged on the side of the conversion layer 30 facing away from the emission regions 20. A surface facing away from the emission regions 20 forms the exit surface 1a of the semiconductor component 1.

The intermediate layer 40 is formed with a transparent material. The refractive index of the intermediate layer 40 is lower than the refractive index of the conversion layer 30. The decoupling of electromagnetic primary L1 and/or secondary radiation L2 from the light-emitting semiconductor component 1 is advantageously improved by means of the intermediate layer 40. In addition, the intermediate layer forms a flat surface, which advantageously facilitates the handling and further processing of the semiconductor component.

FIG. 4A shows a tabular overview of points in a three-dimensional Cartesian coordinate system, which describe a surface of a conversion element 30 that faces away from an emission region 20. The 25 points are located on a surface of a lens-shaped region 32 which is arranged overlapping with an emission region 20 in the vertical direction V. In particular, the surface can be described with a three-dimensional spline function on which the discrete points lie. The spline function describes a surface of a cushion-shaped, lens-shaped area 32, which in plan view has a rectangular-symmetrical contour.

In particular, a semiconductor component 1 includes a plurality of lens-shaped regions 32, the surface of which can be described with the points listed in FIG. 4A. For example, a lens-shaped region 32 with a surface described by the x, y and z-coordinates is arranged downstream of each emission region 20. The x-coordinates, y-coordinates and z-coordinates are length specifications in millimeters along three mutually perpendicular directions. The z-coordinates are length specifications along the vertical direction V and the x- and y-coordinates are length specifications along the main extension plane E of the conversion layer 30.

Each point on the surface of a lens-shaped region 32 is assigned one x-, one y- and one z-coordinate. The x, y, and z-coordinates of a common point are shown in the same row and column of the three tables in each case. For example, a first point on the surface of a lens-shaped region 32 is specified with the x-coordinate of the first row V1 and the first column U1, the y-coordinate of the first row V1 and the first column U1, and the z-coordinate of the first row V1 and the first column U1.

FIG. 4B.1 schematically shows a three-dimensional view of lens-shaped regions 32 which are formed on the surface of the conversion layer 30. The lens-shaped regions 32 are arranged adjacent to one another along a plane, in particular along the main extension plane E.

FIG. 4B.2 shows an enlarged view of a single lens-shaped region 32 of the conversion layer 30 of FIG. 4B.1. The surface of the lens-shaped region 32 which is facing away from the emission regions 20, can be discretely described with the coordinates listed in FIG. 4A, for example.

FIG. 4C schematically shows a sectional view through a lens-shaped region 32 of the conversion layer 30. The section in this case runs along the dashed line A-A shown in FIG. 4B.2

FIG. 4D schematically shows a sectional view through a lens-shaped region 32 of the conversion layer 30. The section in this case runs along the dashed line B-B shown in FIG. 4B.2

Figure 5:
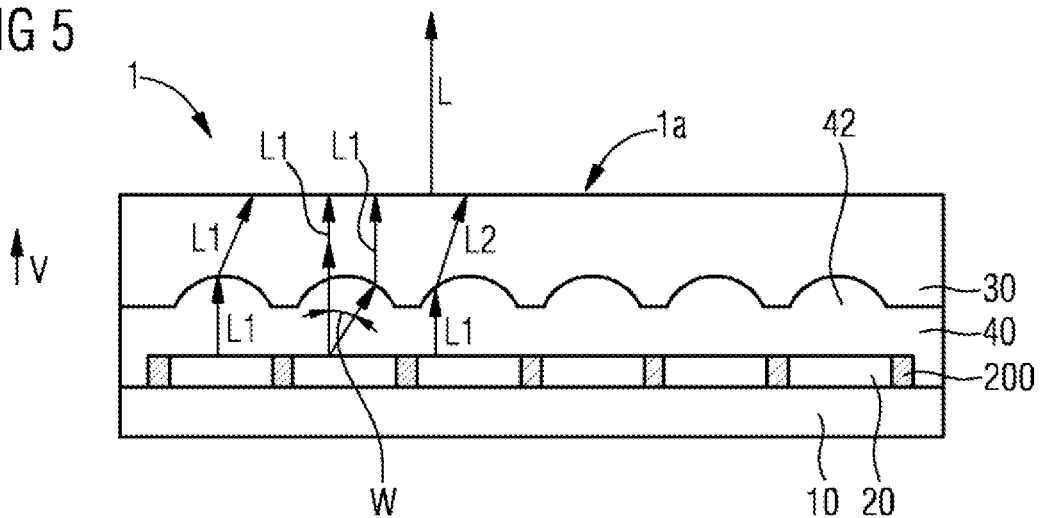

FIG. 5 shows a schematic sectional view of a semiconductor component 1 described here according to an exemplary embodiment. In contrast to the exemplary embodiment shown in FIG. 1, the surfaces of the intermediate layer 40 facing away from the emission regions 20 are curved convex rather than concave. The intermediate layer 40 and the conversion layer 30 have different refractive indices, so that primary radiation L1 is refracted at the transition between the intermediate layer and the conversion layer 30. The interface between the intermediate layer 40 and the conversion layer 30 is designed in such a way that on entering the conversion layer 30, the angle between the vertical direction V and the propagation direction of the primary radiation L1 is reduced on average. In particular, the primary radiation L1 is collimated or focused upon entering the conversion layer 30.

Figure 6:
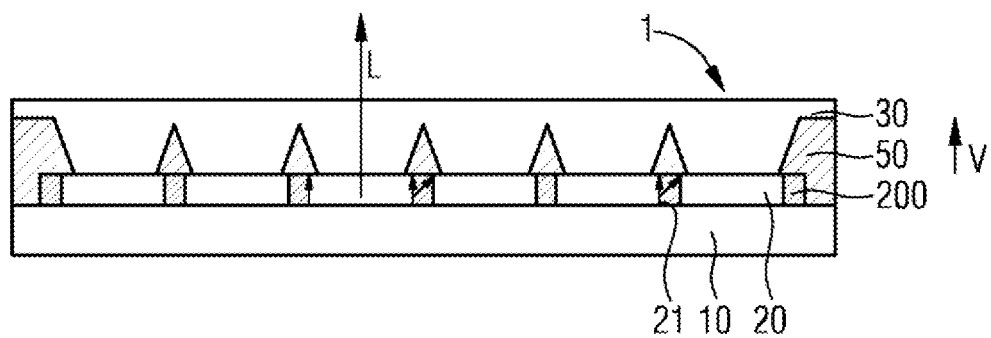

FIG. 6 shows a schematic illustration of an exemplary embodiment of a light-emitting semiconductor component 1. A diaphragm structure 50 which is arranged on the semiconductor chip 200 at least partially overlaps with the emission regions 20. The diaphragm structure 50 is formed with a material that absorbs and/or reflects primary radiation L1. The diaphragm structure 50 overlaps in the vertical direction V with the edges 21 of the emission regions 20, thus limiting the contour of the emission regions 20 in plan view. This limitation advantageously facilitates the collimation of the primary L1 and/or secondary radiation L2 within the conversion layer 30.

The conversion layer 30 is arranged on the diaphragm structure 50. The variation of the thickness D of the conversion layer 30 is determined by means of the diaphragm structure 50. In each of the regions that do not overlap with emission regions along the vertical direction V, the conversion layer 30 has a local minimum of the thickness D. In each of the regions that do overlap with emission regions 20 along the vertical direction V, the conversion layer 30 has a local maximum of the thickness D.

Figure 7:
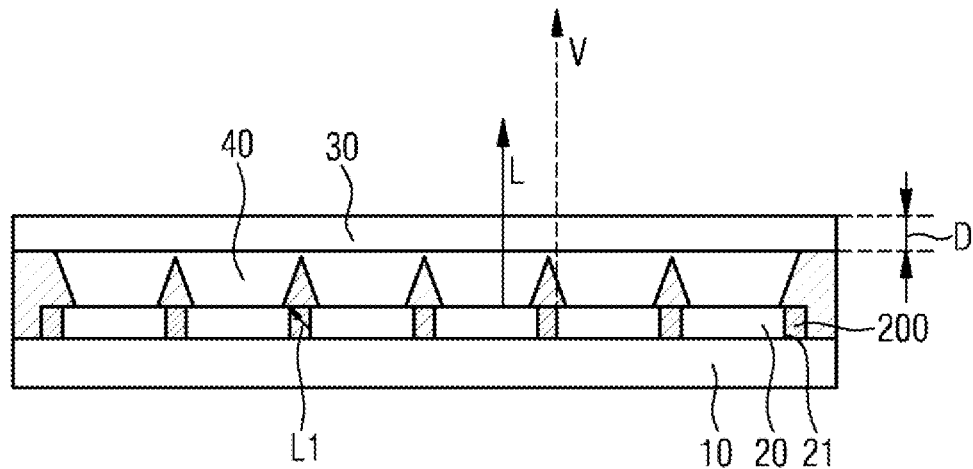

FIG. 7 shows a schematic illustration of an exemplary embodiment of a light-emitting semiconductor component 1. In contrast to the exemplary embodiment shown in FIG. 6, in the exemplary embodiment shown in FIG. 7 the intermediate layer is arranged between the conversion layer 30 and the semiconductor chip 200. The intermediate layer 40 terminates flush with the diaphragm structure 50 along the vertical direction V. The conversion layer 30 has a constant thickness D. Advantageously, the non-scattering intermediate layer 40 is arranged in the region of the diaphragm structure 50, so that before entering the conversion layer 30 a beam-shaping of the primary radiation L1 is possible. For example, by means of the diaphragm structure, the primary radiation L1 is collimated in the region of the intermediate layer, thereby reducing on average the angle of incidence of the primary radiation into the conversion layer 30.

Figure 8:
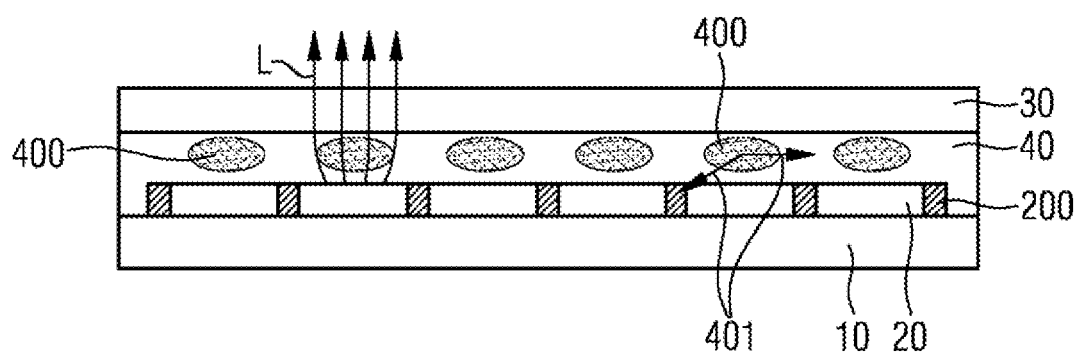

FIG. 8 shows a schematic illustration of an exemplary embodiment of a light-emitting semiconductor component 1. In the semiconductor component 1, a lens array with GRIN lenses 400 is formed in the intermediate layer 40. The GRIN lenses 400 are each formed by means of a refractive index gradient 401. Along the refractive index gradient 401 shown by an arrow, the refractive index decreases in the direction of the arrow. For example, the refractive index is greater in regions that overlap with emission regions in the vertical direction than in regions that do not overlap with emission regions in the vertical direction. One of the GRIN lenses 400 is arranged overlapping with each emission region 20 in the vertical direction V. The GRIN lenses 400 are configured to collimate or focus primary radiation L1. Advantageously, the GRIN lenses 400 are used to focus or collimate the primary radiation L1 in such a way that the mean lengths of the travel paths of the primary radiation L1 within the conversion layer 30 are equalized.

Figure 9:
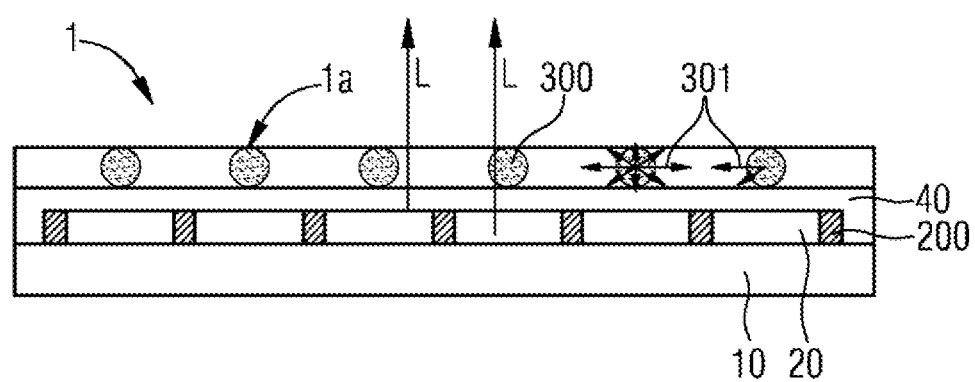

FIG. 9 shows a schematic illustration of an exemplary embodiment of a light-emitting semiconductor component 1. In this exemplary embodiment, the concentration of the conversion material varies along the main extension plane E of the conversion layer 30. For example, the conversion layer 30 has gradient regions 300 with a gradient 301 of the concentration K of the conversion material, which is shown schematically in FIG. 9 with arrows. The concentration K of the conversion material decreases in the direction of the arrows of the concentration gradient 301. The concentration K in the vertical direction V overlapping with each emission region 20 has a local maximum of the concentration K of the conversion material. In each of the regions that do not overlap with emission regions 20 in the vertical direction V, the conversion layer 30 has a local minimum of the concentration K of the conversion material.

The concentration K of the conversion material varies periodically along the main extension plane E of the conversion layer 30. In particular, the periodicity of the variation in the concentration K of the conversion material corresponds to the periodicity with which the emission regions 20 are arranged along the main extension plane E.

Primary radiation L1 travels a shorter distance on average until its conversion to secondary radiation L2 within a part of the conversion layer 30 which overlaps vertically with an emission region 20, than in a part of the conversion layer 30 which does not overlap with an emission region 20. Advantageously, the varying concentration of the conversion material gives rise to a homogeneous chromaticity coordinate of the mixed radiation L emitted through the radiation surface 1a over the radiation surface 1a.

The invention is not limited to the embodiments by the fact that the description is based on them. Rather, the invention includes each new feature, as well as any combination of features, which includes in particular every combination of features in the patent claims, even if this feature or this combination itself is not explicitly specified in the patent claims or exemplary embodiments.

This patent application claims the priority of the German patent application 102018101786.3, the disclosed content of which is hereby incorporated by reference.

LIST OF REFERENCE SIGNS 1 light-emitting semiconductor component
1a radiation surface
10 substrate
20 emission region
21 edge
30 conversion layer
300 gradient region
301 concentration gradient of the conversion medium
32 lens-shaped region
40 intermediate layer
42 lens
400 GRIN lens
401 refractive index gradient
50 diaphragm structure
D thickness
Dmin minimum thickness
Dmax maximum thickness
E main extension plane
K concentration of the conversion material
L radiation
L1 primary radiation
L2 secondary radiation
N1 first refractive index
N2 second refractive index
V vertical direction
W emission angle
U1 first column
U2 second column U3 third column
U4 fourth column
U5 fifth column
V1 first row
V2 second row
V3 third row
V4 fourth row
V5 fifth row

The invention claimed is:

1. A light-emitting semiconductor component comprising:
a plurality of adjacently arranged emission regions configured to be operated separately, individually and/or in groups;
a conversion layer comprising a conversion material;
an intermediate layer having a first refractive index; and
a radiation surface;
wherein:
the conversion layer is arranged downstream of the emission regions in the direction of radiation of the emission regions,
the emission regions are configured to emit primary radiation of a first wavelength range into the conversion layer,
the conversion layer is configured to convert at least a portion of the primary radiation into secondary radiation of a second wavelength range,
mixed radiation is configured to be emitted from the light-emitting semiconductor component at the radiation surface,
the mixed radiation comprises primary radiation and secondary radiation,
a probability that primary radiation travelling from the emission region to the radiation surface is converted into secondary radiation varies along the radiation surface by a maximum factor of 2,
a concentration of the conversion material has in each case a local maximum in the vertical direction in a middle of the conversion layer where it overlaps with the respectively assigned emission region, the concentration of the conversion material in each case decreases along all directions starting from the respective local maximum and seen in cross-section through the conversion layer; and
the concentration of the conversion material varies periodically along a main extension plane of the conversion layer, the periodicity of the variation in the concentration of the conversion material corresponds to a periodicity with which the emission regions are arranged along the main extension plane.

2. The light-emitting semiconductor component as claimed in claim 1, wherein the conversion layer is a contiguous layer.

3. The light-emitting semiconductor component as claimed in claim 1, wherein:
the conversion layer has a thickness along a vertical direction perpendicular to the main extension plane of the conversion layer,
the thickness varies along the main extension plane.

4. The light-emitting semiconductor component as claimed in claim 1, wherein:
the conversion layer has a local maximum thickness in each of the regions that overlap with emission regions along the vertical direction, and
the conversion layer has a local minimum thickness in each region that does not overlap with an emission region along the vertical direction.

5. The light-emitting semiconductor component as claimed in claim 1,
wherein:
the intermediate layer is formed with a material transparent to primary radiation and secondary radiation, and the intermediate layer is a contiguous layer.

6. The light-emitting semiconductor component as claimed in claim 5, wherein:
the intermediate layer is arranged between the conversion layer and the emission regions,
the intermediate layer has convex curved surfaces on one side facing away from the emission regions,
the conversion layer has a local minimum thickness in each of the regions that overlap with an emission region along the vertical direction, and
the conversion layer has a local maximum thickness in each of the regions that do not overlap with an emission region along the vertical direction.

7. The light-emitting semiconductor component as claimed in claim 1,
wherein:
the conversion layer has a second refractive index, the conversion layer is arranged on a side of the intermediate layer facing away from the emission regions and the first refractive index is greater than the second refractive index, or the intermediate layer is arranged on a side of the conversion layer facing away from the emission regions and the second refractive index is greater than the first refractive index.

8. The light-emitting semiconductor component as claimed in claim 7, wherein:
the first refractive index of the intermediate layer varies along the main extension plane, and
the first refractive index has a local extremum in the vertical direction where it overlaps with each emission region.

9. The light-emitting semiconductor component as claimed in claim 8, wherein the intermediate layer forms a lens above each emission region in the vertical direction, wherein the lens is configured to collimate or focus primary radiation.

10. The light-emitting semiconductor component as claimed in claim 9, further comprising a diaphragm structure,
wherein:
the emission regions have edges which limit the emission regions along the main extension plane,
the diaphragm structure is arranged vertically overlapping with the edges, and the diaphragm structure comprises a material that absorbs and/or reflects the primary radiation.

11. The light-emitting semiconductor component as claimed in claim 1, wherein the emission regions are parts of a common semiconductor chip.

12. A light-emitting semiconductor component, comprising:
a plurality of adjacently arranged emission regions that can be separately operated, individually and/or in groups;
a conversion layer comprising a conversion material;
an intermediate layer having a first refractive index;
a radiation surface;
wherein:
the emission regions are part of a common semiconductor chip, the conversion layer is arranged downstream of the emission regions in the direction of radiation of the emission regions, the emission regions emit primary radiation of a first wavelength range into the conversion layer, the conversion layer converts at least a portion of the primary radiation into secondary radiation of a second wavelength range, mixed radiation is configured to be emitted from the light-emitting semiconductor component at the radiation surface, the mixed radiation comprises primary radiation and secondary radiation, and a probability that primary radiation travelling from the emission region to the radiation surface is converted into secondary radiation varies along the radiation surface by a maximum factor of 2, a concentration of the conversion material has in each case a local maximum in the vertical direction in a middle of the conversion layer where it overlaps with the respectively assigned emission region, the concentration of the conversion material in each case decreases along all directions starting from the respective local maximum and seen in cross-section through the conversion layer; and the concentration of the conversion material varies periodically along the main extension plane of the conversion layer, the periodicity of the variation in the concentration of the conversion material corresponds to a periodicity with which the emission regions are arranged along the main extension plane.

* * * * *